United States Patent
Martin et al.

(10) Patent No.: US 6,253,115 B1
(45) Date of Patent: Jun. 26, 2001

(54) SYSTEM FOR IMPLEMENTING A DESIGN FOR SIX SIGMA PROCESS

(75) Inventors: Arlie Russell Martin, Ballston Spa; Ahmed Elasser, Latham; Mohamed Ahmed Ali; Virendra Kumar, both of Niskayuna; Jan Henning Aase, Rexford, all of NY (US); Brian Eric Lindholm, Christiansburg, VA (US); Mark Andrew Kolb, Round Rock, TX (US)

(73) Assignee: General Electric Company, Schenectady, NY (US)

(*) Notice: Subject to any disclaimer, the term of this patent is extended or adjusted under 35 U.S.C. 154(b) by 0 days.

(21) Appl. No.: 09/218,685

(22) Filed: Dec. 22, 1998

(51) Int. Cl.⁷ ........................................ G06F 19/00
(52) U.S. Cl. .................................... 700/97; 702/81
(58) Field of Search ............................. 700/95, 97, 109, 700/110; 702/81, 84, 185

(56) References Cited

U.S. PATENT DOCUMENTS

| | | | |
|---|---|---|---|
| 5,301,118 | 4/1994 | Heck et al. | 700/109 |
| 5,337,462 * | 8/1994 | Hedman | 29/33 P |
| 5,452,218 | 9/1995 | Tucker et al. | 700/110 |
| 5,539,652 * | 7/1996 | Tegethoff | 703/14 |
| 5,581,466 | 12/1996 | Van Wyk et al. | 700/95 |
| 5,715,181 | 2/1998 | Horst | 702/180 |
| 5,761,093 | 6/1998 | Urbish et al. | 700/107 |
| 5,956,251 * | 9/1999 | Atkinson et al. | 700/109 |

FOREIGN PATENT DOCUMENTS 0 811 941 A2  10/1997  (EP).

* cited by examiner

Primary Examiner—William Grant
Assistant Examiner—Zoila Cabrera
(74) Attorney, Agent, or Firm—Noreen C. Johnson; Douglas E. Stoner

(57) ABSTRACT

A system for implementing a design for six sigma process having a plurality of sub-processes each having a plurality of sub-steps. The system includes an independent main application for implementing the design for six sigma process. A series of independent sub-process applications each implements one sub-process of the design for six sigma process. A tool library containing a plurality of executable tools is accessible by the main application and sub-process applications to access and execute the plurality of executable tools. A communications path interconnects the main application, the sub-process applications, and the tool library.

14 Claims, 5 Drawing Sheets

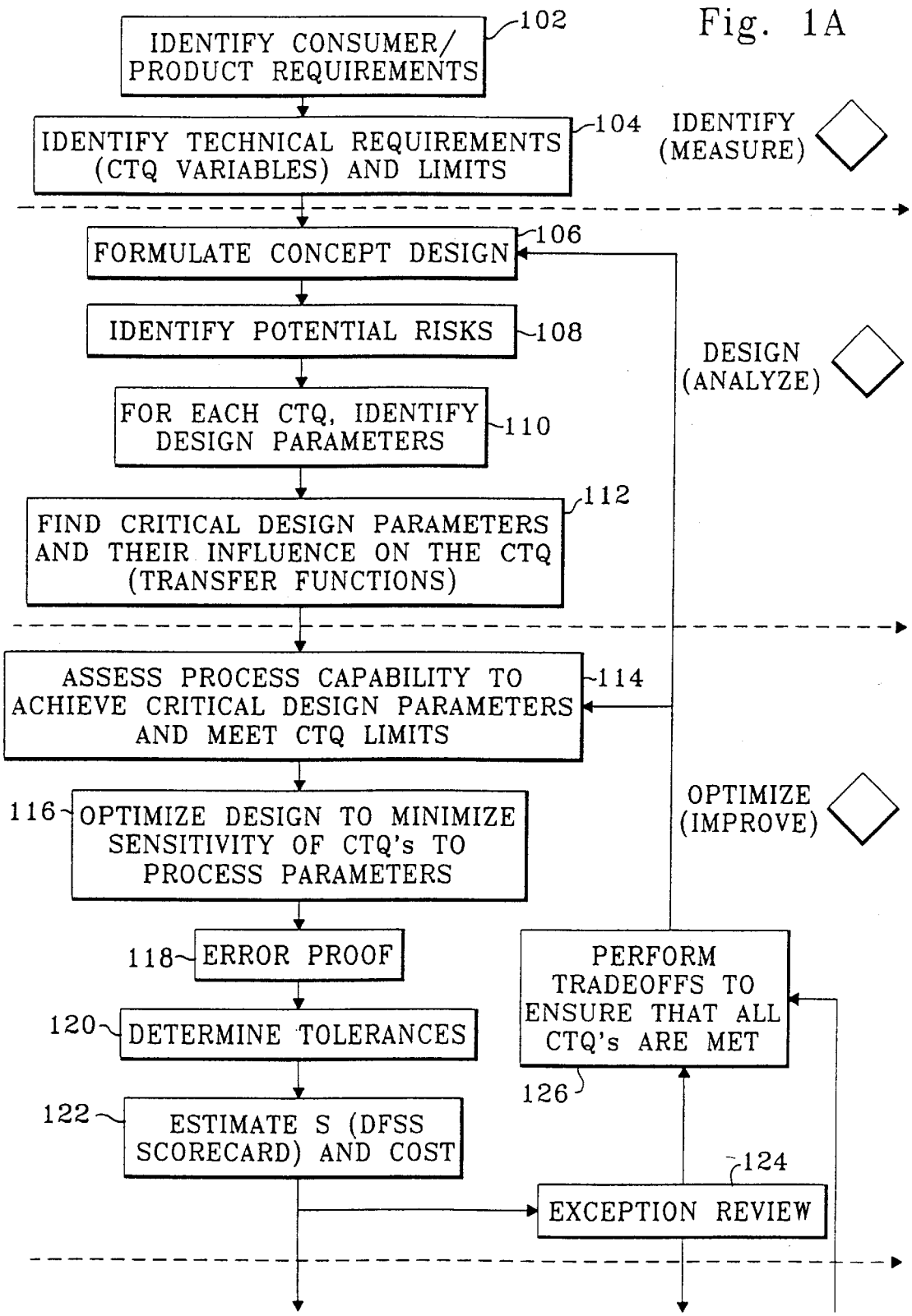

DESIGN FOR SIGMA PROCESS

SYSTEM FOR IMPLEMENTING A DESIGN FOR SIX SIGMA PROCESS

BACKGROUND OF THE INVENTION

The invention relates to a system for implementing a design for six sigma (DFSS) process. For any process (business, manufacturing, service, etc.), the sigma value is a metric that indicates how well that process is performing. The higher the sigma value, the better the output. Sigma measures the capability of the process to perform defect-free-work, where a defect is synonymous with customer dissatisfaction. With six sigma the common measurement index is defects-per-unit where a unit can be virtually anything—a component, a part of a jet engine, an administrative procedure, etc. The sigma value indicates how often defects are likely to occur. As sigma increases, customer satisfaction goes up along with improvement of other metrics (e.g., cost and cycle time).

The six sigma methodology has been used by a number of companies such as Motorola Semiconductors, Texas Instruments, Allied Signal and Digital Corporation. All of these companies use this process for a specific application such as semiconductor manufacturing in the case of Motorola and Texas Instruments. A drawback to specific applications of the six sigma process is that there is a lack of flexibility to allow for the existing implementation to be applied to other business processes.

BRIEF SUMMARY OF THE INVENTION

An exemplary embodiment of the invention is a system for implementing a design for six sigma process having a plurality of sub-processes each having a plurality of sub-steps. The system includes an independent main application for implementing the design for six sigma process. A series of independent sub-process applications each implements one sub-process of the design for six sigma process. A tool library containing a plurality of executable tools is accessible by the main application and sub-process applications to access and execute the plurality of executable tools. A communications path interconnects the main application, the sub-process applications, and the tool library.

BRIEF DESCRIPTION OF THE DRAWINGS

Referring now to the drawings wherein like elements are numbered alike in the several Figures:

FIGS. 1A and 1B present a flowchart (collectively referred to as FIG. 1) of a design for six sigma process that may be implemented by the present invention;

DETAILED DESCRIPTION OF THE INVENTION

Figure 1B:
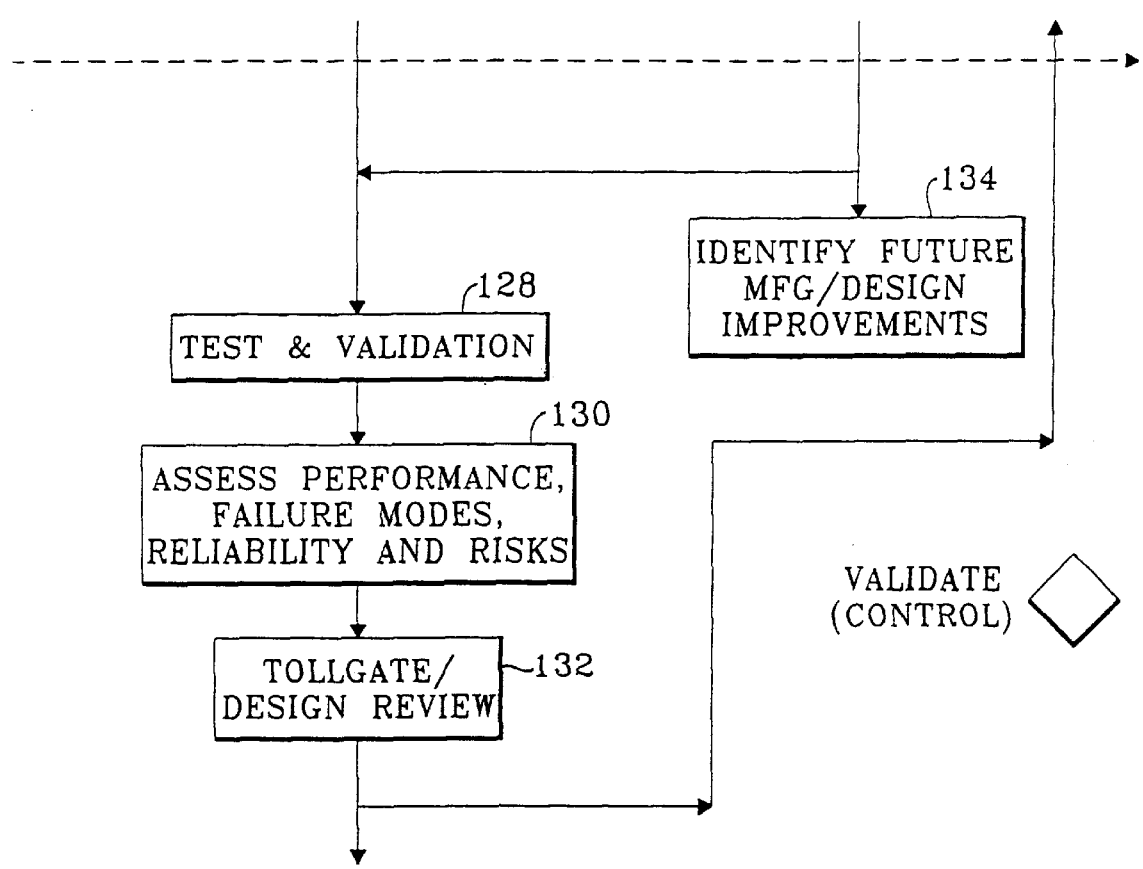

FIG. 1 is a flowchart of a design for six sigma (DFSS) process that may be implemented using the present invention. The overall DFSS process of FIG. 1 is divided into four sub-processes labeled Identify, Design, Optimize and Validate. Each sub-process includes sub-steps. The Identify sub-process includes sub-steps 102 and 104. The Design sub-process includes sub-steps 106–112. The Optimize sub-process includes sub-steps 114–126. The Validate sub-process includes sub-steps 128–134. The DFSS process shown in FIG. 1 is useful for improving the process of designing a product or procedure. The invention can also be applied to other six sigma processes such as the Measure, Analyze, Improve and Control (MAIC) process used for improving processes (such as manufacturing processes or business processes). The invention is a system for implementing a design for six sigma process and may be used with other six sigma processes or similar processes.

Figure 2:
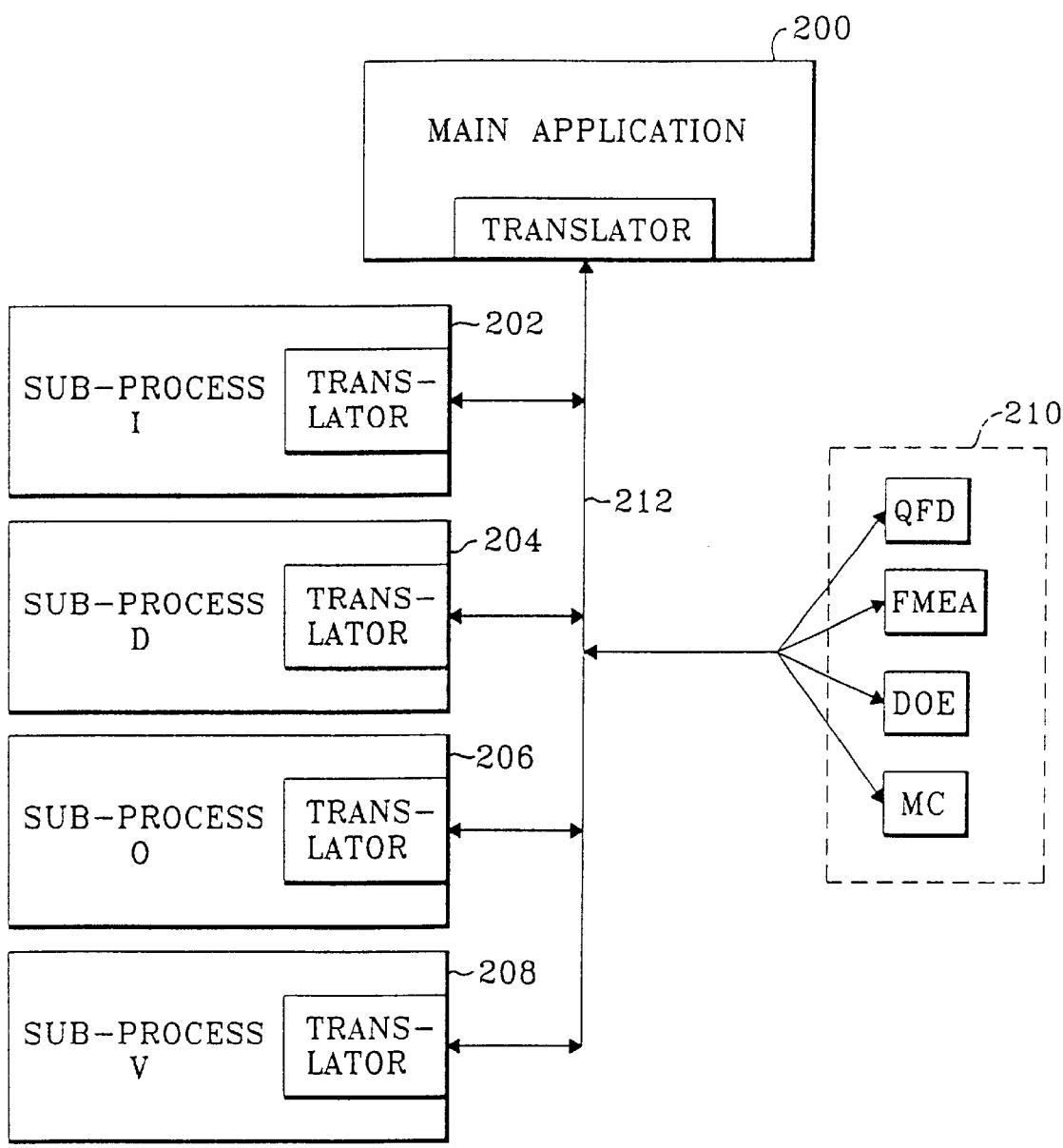
FIG. 2 is a block diagram of the system for implementing a design for six sigma process.

FIG. 2 is block diagram of a system for implementing a DFSS process in an exemplary embodiment of the invention. To implement the DFSS process in a generic manner, a number of stand-alone applications 200, 202, 204, 206 and 208 are used. Each application is independent and can be executed or modified without interaction with other applications. Each application can be saved independently and re-used and can communicate with other applications over a communication path 212. As will be described in more detail below, each application also has access (via communication path 212) to a plurality of tools stored in a tool library 210.

Main application 200 controls implementation of the overall DFSS process shown in FIG. 1. The main process application 200 can launch each of the sub-process applications 202, 204, 206 and 208. The Identify sub-process application 202 implements steps 102–104 shown in FIG. 1. The Design sub-process application 20 4 implements steps 106–112 shown in FIG. 1. The Optimize sub-process application 206 implements steps 114–126 shown in FIG. 1. The Validate sub-process application 208 implements steps 128–134 shown in FIG. 1. The main process application 200 and the sub-process applications 202–208 are designed to communicate with each other over communication path 212. The main application 200 and sub-process applications 202–208 can also access tools in tool library 210 over communications path 212. The communications path 212 interconnects all the components of the system and allows the user to independently access only the portions that are needed for a particular task. Tools in tool library 210 can also access other tools through communications path 212. It is understood that FIG. 2 is an exemplary embodiment and other configurations may be used. For example, the number and types of stand-alone applications may be varied.

The main process application 200 and each sub-process application 202–208 can access and execute tools contained in a tool library 210. Tool library 210 contains a variety of tools useful in implementing the DFSS process. In one example, tool library 210 includes common engineering tools such as, but not limited to, ANSYS (finite element tool tool), Minitab (general-purpose statistical tool), and Saber (electrical/electronic tool), as well as statistical tools and methods such as, but not limited to, Quality Function Deployment (QFD), Failure Mode and Effect Analysis (FMEA), Design of Experiments (DOE), Monte-Carlo (MC) and many other tools. The QFD tool helps the user select critical-to-quality (CTQ) variables. The FMEA tool allows the user to perform a failure mode and effect analysis to identify major problems and risks associated with a given design. In one embodiment, each application also includes an automatic experimentation capability which allows the user to enter data in either a manual mode or an automatic mode. The automatic mode allows for easy integration of various engineering tools and also allows the user to automate repetitive processes and tasks.

Figure 3:
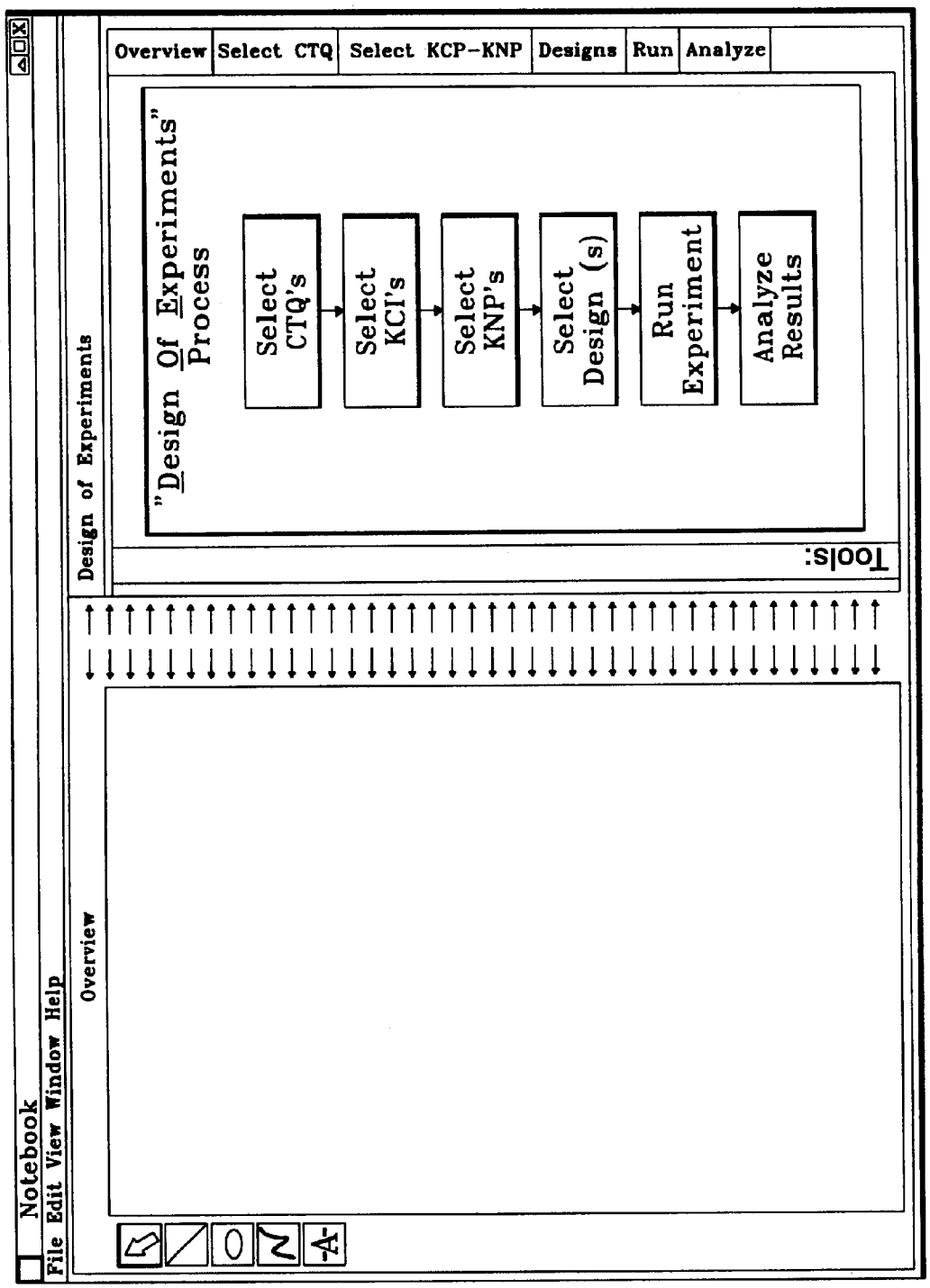
FIGS. 3 and 4 illustrate execution of a tool in accordance with the present invention.
Figure 4:
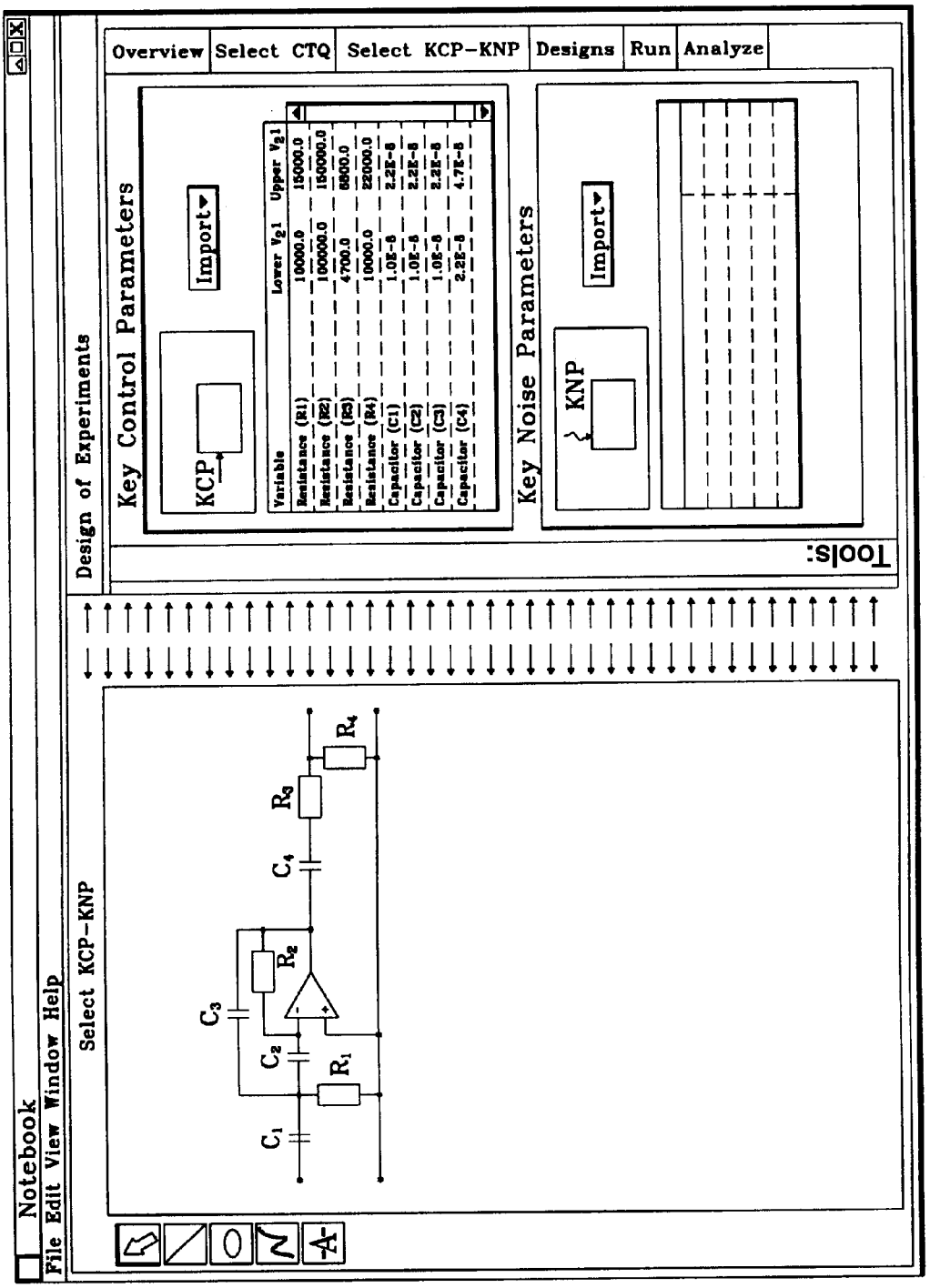

FIGS. 3 and 4 depict an exemplary usage of the DOE tool from tool library 210. The DOE tool can be launched, for example, from step 110 of FIG. 1 to screen design parameters or from step 114 in accordance with the response surface methodology. The user executes one of the applications 200–208 and accesses the DOE tool in tool library 210.

FIG. 3 shows an initial screen that would be presented to the user which provides the overall DOE process. FIG. 4 depicts a screen for designating key control parameters (KCP's) and key noise parameters (KNP's) within the DOE process. The DOE process is itself a process, and can have sub-processes, sub-steps, etc. It can also have access to other tools in tool library 210 via communications path 212. Other tools in the tool library 210 may have similar characteristics. Other tools in the tool library are accessed and executed in a similar fashion.

The tool library 210 may also contain custom tools developed by a user or group of users including quality function deployment tools, design generation tools for generating experimental designs, response surface tools for generating transfer functions, optimization tools for optimizing processes and scorecards for defect per unit calculation.

The DOE tool is enhanced by including access to custom designs generated by a particular user. Even though the invention provides a generic system for implementing a DFSS process, tools can be customized for a particular user. For example, the DOE tool is enhanced by including access to custom designs generated by a particular user. In one example, additional advantages of the DOE tool include access to a Microsoft access database (containing 300+ experimental designs) and designs for large number of parameters. Moreover, in this example, the database provides access to special purpose designs such as mixed level and optimal designs (e.g. D-optimal).

Tools for advanced regression techniques may also be included in tool library 210. These techniques help users determine transfer functions by providing automatic detection for confounding, a search algorithm for maximum $R^2$ (or adjusted $R^2$ or any other similar statistic or measure of the quality of fit).

To allow for communication with a variety of tools, each application 200–208 has a translator that allows it to communicate and execute various external tools (e.g., commercial applications such as ANSYS, Saber, Excel, etc.). The translator provides a standard communications interface to the application which enables other components of the system to access functions of that particular application in a standardized manner. In addition, the Java programming language and platform can be used to implement each application 200–208. The object oriented programming (OOP) approach used in the Java programming language allows for easy implementation of the DFSS process. The portability of the Java programming language to various platforms (e.g., PC, UNIX, etc.) allows the software to operate under different operating systems. The whole process is modeled in the form of an OOP data structure for easy implementation. In one example, a graphical user interface (GUI) is also implemented in the Java programming language in order to allow each application to communicate with other tools such as engineering tools and statistical tools. Communication with Microsoft object linking and embedding (OLE) and with dynamic data exchange (DDE) is provided via the Java programming language to OLE and DDE servers. The system has an open architecture allowing users to write their own translators. Thus, other communications methods (other than OLE, etc.) can be supported by the system.

Each application 200–208 used to implement the DFSS process has two main components. A first component of the application is a structured design that models processes and methods. The second component of the application is an unstructured design that serves as a documentation area for designers to document their processes and methods by entering notes, comments, etc. The information in the documentation area may be archived for future reference. Each application may also include an advisor to help the user make educated choices and judgments. Each application may include a database that documents information relevant to the application.

The present invention provides a generic implementation of DFSS process. The generic nature of the invention makes it easily adaptable to other engineering and quality processes such as systems engineering, tolerance analysis, etc. The use of object oriented programming and translators allows each application to communicate over a variety of platforms with a variety of tools.

The present invention can be embodied in the form of computer-implemented processes and apparatuses for practicing those processes. The present invention can also be embodied in the form of computer program code containing instructions embodied in tangible media, such as floppy diskettes, CD-ROMs, hard drives, or any other computer-readable storage medium, wherein, when the computer program code is loaded into and executed by a computer, the computer becomes an apparatus for practicing the invention. The present invention can also be embodied in the form of computer program code, for example, whether stored in a storage medium, loaded into and/or executed by a computer, or transmitted over some transmission medium, such as over electrical wiring or cabling, through fiber optics, or via electromagnetic radiation, wherein, when the computer program code is loaded into and executed by a computer, the computer becomes an apparatus for practicing the invention. When implemented on a general-purpose microprocessor, the computer program code segments configure the microprocessor to create specific logic circuits.

While preferred embodiments have been shown and described, various modifications and substitutions may be made thereto without departing from the spirit and scope of the invention. Accordingly, it is to be understood that the present invention has been described by way of illustration and not limitation.

What is claimed is:

1. A system for implementing a design for six sigma process having a plurality of sub-processes each having a plurality of sub-steps, said system comprising:

an independent main application for implementing the design for six sigma process;

a plurality of independent sub-process applications, each implementing one sub-process of the design for six sigma process;

a tool library containing a plurality of executable tools, said main application and said sub-process applications configured to access and execute said plurality of executable tools; and a communications path for interconnecting said main application, said sub-process applications and said tool library.

2. The system of claim 1 wherein said main application includes a translator for enabling communication between said main application and at least one of said executable tools.

3. The system of claim 1 wherein each of said sub-process applications includes a translator for enabling communication between said sub-process applications and at least one of said executable tools.

4. The system of claim 1 wherein said executable tools include design tools.

5. The system of claim 1 wherein said executable tools include statistical analysis tools.

6. The system of claim 1 wherein said executable tools include user developed tools.

7. The system of claim 1 wherein at least one of said executable tools is a stand-alone process including a plurality of sub-processes.

8. A storage medium encoded with machine-readable computer program code for implementing a design for six sigma process having a plurality of sub-processes each having a plurality of sub-steps, the program code configuring a computer to establish:

an independent main application for implementing the design for six sigma process;

a plurality of independent sub-process applications, each implementing one sub-process of the design for six sigma process;

a tool library containing a plurality of executable tools, said main application and said sub-process applications configured to access and execute said plurality of executable tools; and a communications path for interconnecting said main application, said sub-process applications and said tool library.

9. The storage medium of claim 8 wherein said main application includes a translator for enabling communication between said main application and at least one of said executable tools.

10. The storage medium of claim 8 wherein each of said sub-process applications includes a translator for enabling communication between said sub-process applications and at least one of said executable tools.

11. The storage medium of claim 8 wherein said executable tools include design tools.

12. The storage medium of claim 8 wherein said executable tools include statistical analysis tools.

13. The storage medium of claim 8 wherein said executable tools include user developed tools.

14. The storage medium of claim 8 wherein at least one of said executable tools is a stand-alone process including a plurality of sub-processes.

* * * * *